(12) United States Patent
Lee

(10) Patent No.: US 10,802,268 B2
(45) Date of Patent: Oct. 13, 2020

(54) ORGANIC LIGHT EMITTING DISPLAY PANEL, ORGANIC LIGHT EMITTING DISPLAY DEVICE HAVING THE SAME, AND LIQUID CRYSTAL DISPLAY DEVICE

(71) Applicant: SAMSUNG DISPLAY CO., LTD., Yongin-si, Gyeonggi-do (KR)

(72) Inventor: Hyunwoo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 222 days.

(21) Appl. No.: 15/867,438

(22) Filed: Jan. 10, 2018

(65) Prior Publication Data

US 2019/0025571 A1 Jan. 24, 2019

(30) Foreign Application Priority Data

Jul. 24, 2017 (KR) .................. 10-2017-0093716

(51) Int. Cl.
*G02B 26/08* (2006.01)
*G02F 1/13* (2006.01)
*H01L 27/32* (2006.01)

(52) U.S. Cl.
CPC ......... *G02B 26/08* (2013.01); *G02B 26/0858* (2013.01); *G02F 1/1323* (2013.01); *H01L 27/3225* (2013.01)

(58) Field of Classification Search
CPC ... G02F 1/1323; H01L 27/3225; G02B 26/08; G02B 26/0858
See application file for complete search history.

(56) References Cited

U.S. PATENT DOCUMENTS

2014/0015402 A1* 1/2014 Ahn .................... H01L 27/3225
 313/511
2018/0239189 A1* 8/2018 Koito ................ G02F 1/133526

FOREIGN PATENT DOCUMENTS

JP 2014-085666 A 5/2014
KR 10-2014-0052819 A 5/2014

* cited by examiner

*Primary Examiner* — Thanh Nhan P Nguyen
(74) *Attorney, Agent, or Firm* — Lewis Roca Rothgerber Christie LLP

(57) ABSTRACT

An organic light emitting display panel includes a first substrate, a second substrate arranged opposite to the first substrate, a display layer on a side of the first substrate facing the second substrate, and a viewing angle control layer on a side of the second substrate facing the first substrate, the viewing angle control layer configured to change an output path of light input from the display layer by changing a shape based on a control signal.

16 Claims, 11 Drawing Sheets

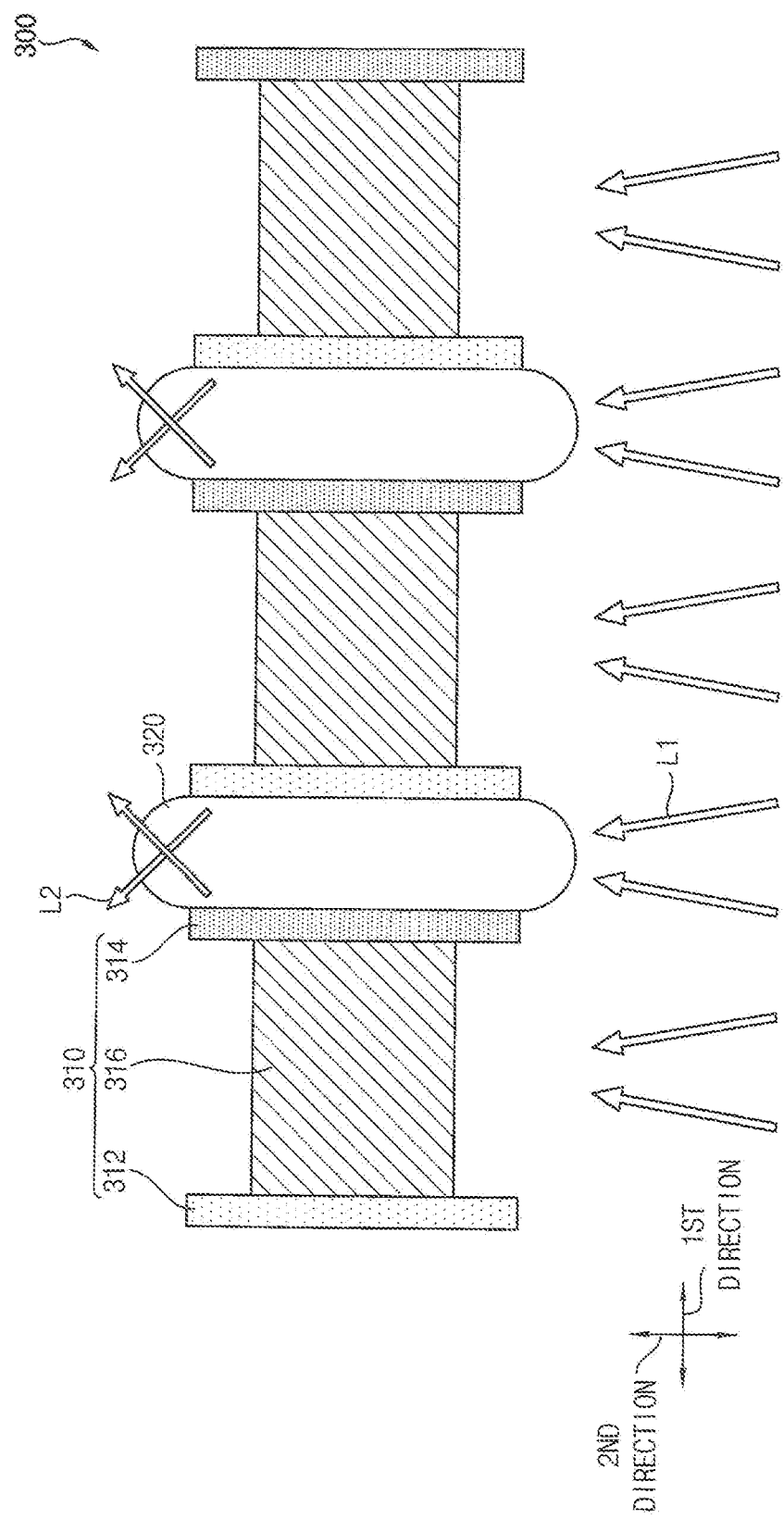

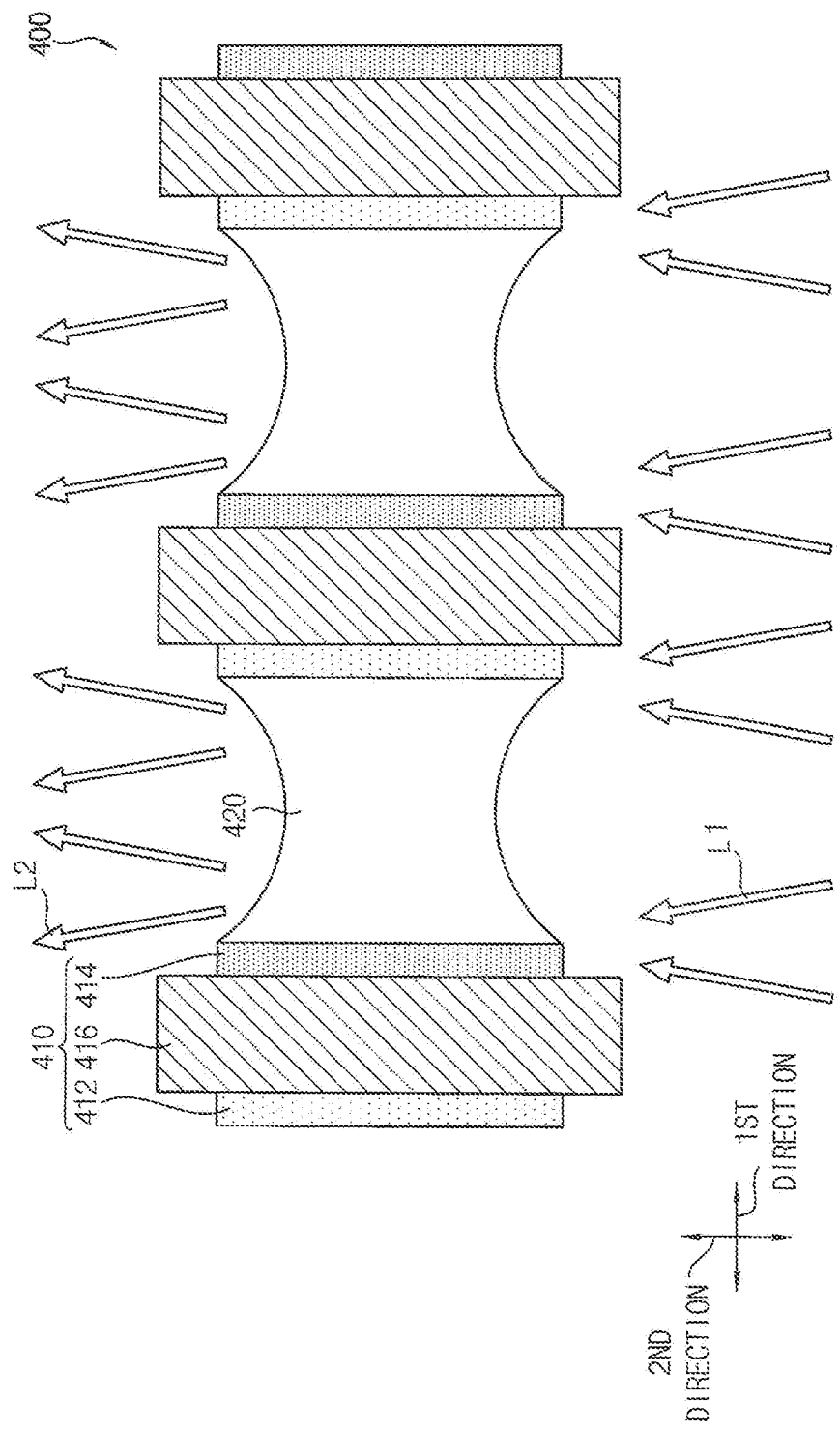

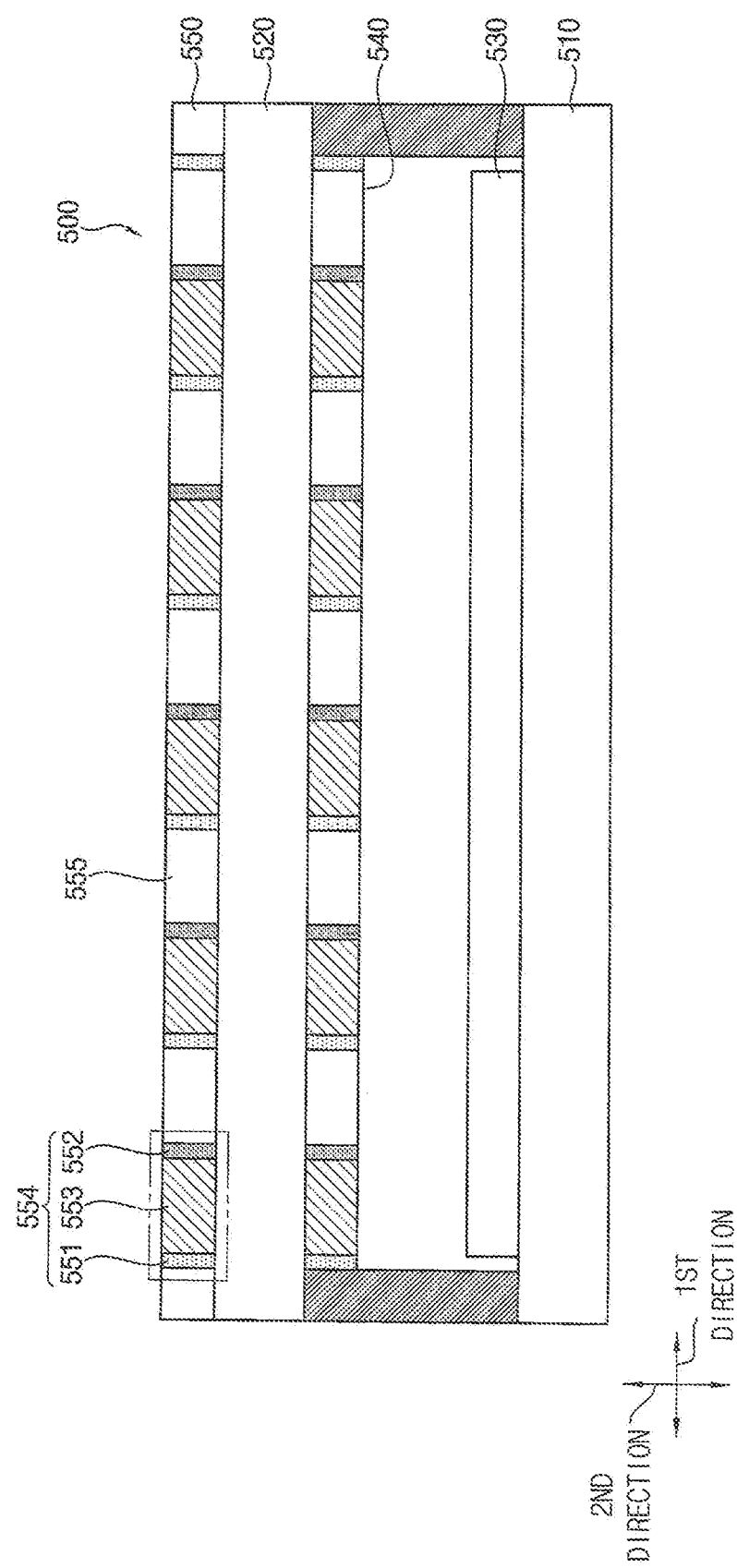

ORGANIC LIGHT EMITTING DISPLAY PANEL, ORGANIC LIGHT EMITTING DISPLAY DEVICE HAVING THE SAME, AND LIQUID CRYSTAL DISPLAY DEVICE

CROSS-REFERENCE TO RELATED APPLICATION

This application claims priority to and the benefit of Korean Patent Application No. 10-2017-0093716, filed on Jul. 24, 2017 in the Korean Intellectual Property Office (KIPO), the entire content of which is incorporated herein by reference.

BACKGROUND

1. Field

Aspects of embodiments relate to an organic light emitting display panel, an organic light emitting display device having the same, and a liquid crystal display device.

2. Description of the Related Art

Flat panel display (FPD) devices are widely used as a display device of electronic devices because FPD devices are relatively lightweight and thin compared to cathode-ray tube (CRT) display devices. Examples of FPD devices are liquid crystal display (LCD) devices, field emission display (FED) devices, plasma display panel (PDP) devices, and organic light emitting display (OLED) devices. The OLED devices have been spotlighted as next-generation display devices because the OLED devices have various advantages such as a wide viewing angle, a rapid response speed, a thin thickness, low power consumption, etc.

Recently, the display device is widely applied to an electronic device, such as a mobile communication device, a digital camera, a laptop, a monitor, a television, etc. The display device that flexibly corresponds to a usage environment is needed as the usage environment of the display device is diversified.

SUMMARY

According to an aspect of one or more embodiments, an organic light emitting display panel is capable of controlling a viewing angle.

According to another aspect of one or more embodiments, an organic light emitting display device is capable of controlling a viewing angle.

According to an aspect of one or more embodiments, a liquid crystal display device is capable of controlling a viewing angle.

According to an aspect of example embodiments, an organic light emitting display panel may include: a first substrate; a second substrate arranged opposite to the first substrate; a display layer on a side of the first substrate facing the second substrate, wherein organic light emitting elements are arranged in the display layer; and a viewing angle control layer on a side of the second substrate facing the first substrate, the viewing angle control layer configured to change an output path of light input from the display layer by changing a shape based on a control signal.

In example embodiments, the viewing angle control layer may include piezoelectric elements of which the shape is changed based on the control signal, and a transparent elastomer arranged between the piezoelectric elements.

In example embodiments, the viewing angle control layer may include the piezoelectric elements and the transparent elastomers alternately disposed.

In example embodiments, the piezoelectric element may include a first transparent electrode and a second transparent electrode configured to receive the control signal, and a piezoelectric material between the first transparent electrode and the second transparent electrode.

In example embodiments, a shape of the piezoelectric element may be changed based on a polarity of the control signal.

In example embodiments, the transparent elastomer may contract or expand based on a shape of the piezoelectric element.

In example embodiments, the output path of light may be changed based on a shape of the transparent elastomer.

In example embodiments, the viewing angle control layer may be coupled to a viewing angle controller that receives a viewing angle mode information and provides the control signal based on the viewing angle mode information.

In example embodiments, the piezoelectric element may be expanded and the transparent elastomer may be contracted based on the control signal when the viewing angle mode information is a wide viewing angle mode.

In example embodiments, the piezoelectric element may be contracted and the transparent elastomer may be expanded based on the control signal when the viewing angle mode information is a narrow viewing angle mode.

In example embodiments, the organic emitting display panel may further include another viewing angle control layer on another side of the second substrate from which light is emitted.

According to an aspect of example embodiments, an organic light emitting display device may include: a display panel including a plurality of pixels and a viewing angle control layer that changes an output path of light by changing a shape based on a control signal; a scan driver configured to provide a scan signal to the display panel; a data driver configured to provide a data signal to the display panel; and a timing controller configured to provide a control signal to the scan driver and the data driver.

In example embodiments, the display panel may include: a first substrate; a second substrate arranged opposite to the first substrate; a display layer on a side of the first substrate facing the second substrate, wherein organic light emitting elements are arranged in the display layer; and a viewing angle control layer on a side of the second substrate facing the first substrate, wherein the viewing angle control layer is configured to change an output path of light input from the display layer by changing a shape based on the control signal.

In example embodiments, the viewing angle control layer may include piezoelectric elements of which a shape is changed based on the control signal and a transparent elastomer arranged between the piezoelectric elements.

In example embodiments, the viewing angle control layer may include the piezoelectric elements and the transparent elastomers alternately disposed.

In example embodiments, the piezoelectric element may include a first transparent electrode and a second transparent electrode configured to receive the control signal, and a piezoelectric material between the first transparent electrode and the second transparent electrode.

According to an aspect of example embodiments, a liquid crystal display device may include: a liquid crystal display panel including a plurality of pixels; a backlight unit configured to provide light to the liquid crystal display panel; a viewing angle control layer on, a side of the liquid crystal display panel facing the backlight unit, the viewing angle control layer configured to change an output path of light input from the backlight unit by changing a shape based on a control signal.

In example embodiments, the viewing angle control layer may include piezoelectric elements configured to change a shape based on the control signal and a transparent elastomer arranged between the piezoelectric elements.

In example embodiments, the piezoelectric element may include a first transparent electrode and a second transparent electrode configured to receive the control signal and a piezoelectric material disposed between the first transparent electrode and the second transparent electrode.

In example embodiments, the liquid crystal display device may further include another viewing angle control layer on another side of the liquid crystal display panel from which the light output.

Therefore, an organic light emitting display panel and an organic light emitting display device may change a path of light emitting from a display layer by including a viewing angle control layer that includes a piezoelectric element and a transparent elastomer on the display layer and changing a shape of the transparent elastomer based on a viewing angle mode. Further, a liquid crystal display device may change a path of light emitting from a liquid crystal display panel by including a viewing angle control layer that includes a piezoelectric element and a transparent elastomer on the liquid crystal display panel disposed on a backlight unit and changing a shape of the transparent elastomer based on a viewing angle mode.

BRIEF DESCRIPTION OF THE DRAWINGS

Some illustrative, non-limiting example embodiments will be more clearly understood from the following detailed description taken in conjunction with the accompanying drawings.

FIGS. 4A and 4B are diagrams illustrating an operation of a viewing angle control layer included on the organic light emitting display panel of FIG. 1.

FIG. 5 is a diagram illustrating an organic light emitting display panel according to other example embodiments.

DETAILED DESCRIPTION

Herein; some example embodiments of the present inventive concept will be explained in further detail with reference to the accompanying drawings.

Figure 1:
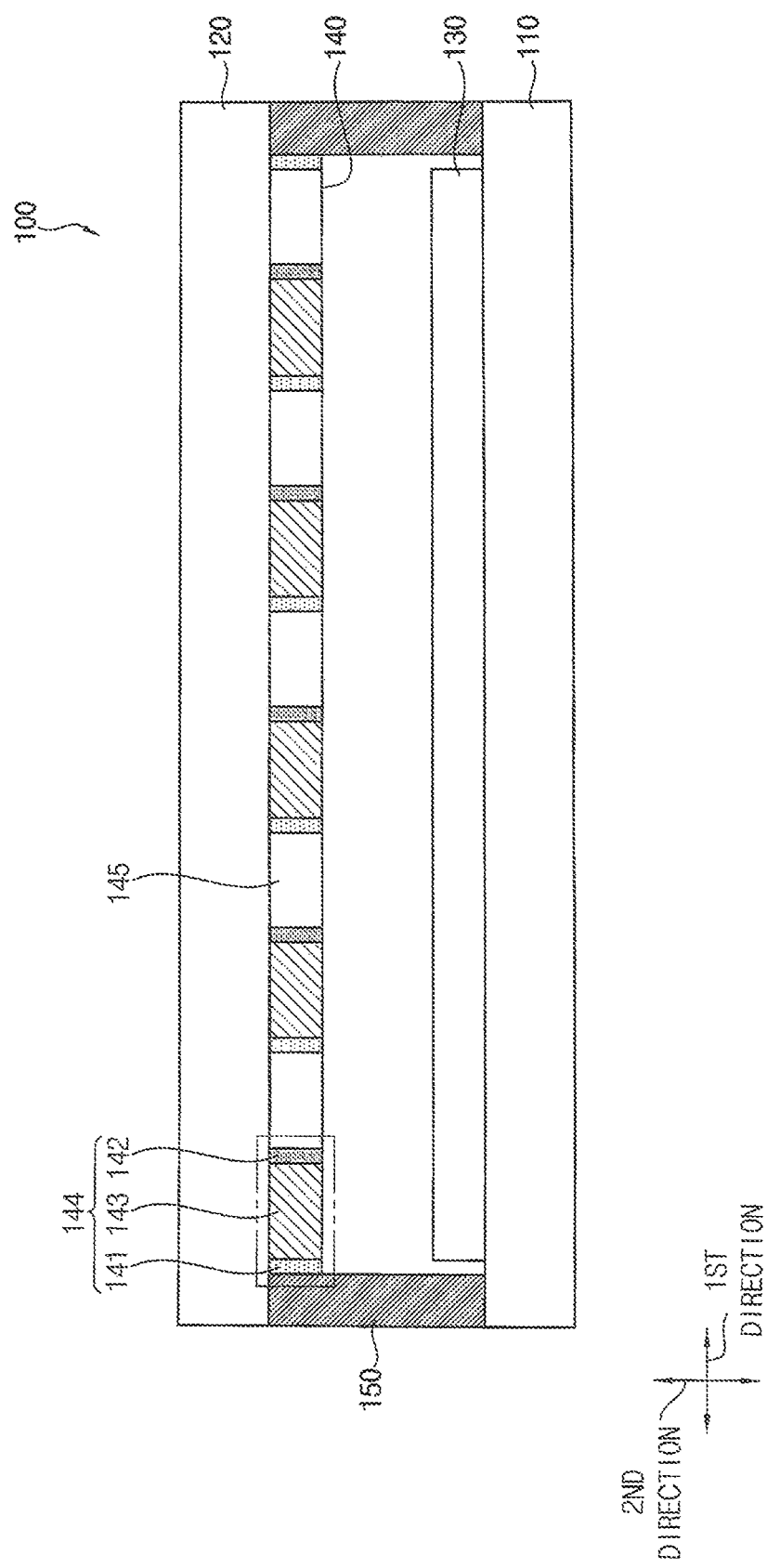
FIG. 1 is a diagram illustrating an organic light emitting display panel according to example embodiments.

FIG. 1 is a diagram illustrating an organic light emitting display panel according to example embodiments.

Referring to FIG. 1, an organic light emitting display panel 100 may include a first substrate 110, a second substrate 120, a display layer 130, and a viewing angle control layer 140.

The first substrate 110 may be selected among a glass substrate, a quartz substrate, a metal substrate, etc. Here, the first substrate 110 may be a flexible substrate. However, the first substrate 100 is not limited thereto.

The second substrate 120 may be disposed opposite to the first substrate 110. The second substrate 120 may be selected among a glass substrate, a quartz substrate, a metal substrate, etc. Here, the second substrate 120 may be a flexible substrate. However, the second substrate 120 is not limited thereto. The second substrate 120 may be disposed on the display layer 130 and the viewing angle control layer 140 that are disposed on the first substrate 110. The second substrate 120 may perform as an encapsulation substrate.

The first substrate 110 and the second substrate 120 may be combined using a sealing member 150.

The display layer 130 may be formed on a side of the first substrate 110 facing the second substrate 120. Organic Halt emitting elements and thin film transistors (TFT) that drive the organic light emitting elements are formed in the display layer 130.

The display layer 130 may include a plurality of pixels. A driving circuit that includes a switching thin film transistor, a driving thin film transistor, and a capacitor may be formed on each of the pixels. Here, the driving transistor may include at least one switching transistor and at least one capacitor. The driving transistor may have any of various structures. A scan line disposed according to a direction, a data line disposed according to another direction, and a power providing line that provides a power voltage may be disposed in the display layer 130. The driving circuit may be driven in response to signals provided through the scan line, the data line, and the power providing line. Further, the organic light emitting element that emits light by coupling to the driving circuit may be formed in the display layer 130. The organic light emitting element may include a pixel electrode, an organic light emitting layer formed on the pixel electrode, and a common electrode formed on the organic light emitting layer. The organic light emitting element may emit light when holes and electrons that inject to the organic light emitting layer from the pixel electrode and the common electrode are combined and converted from an excited state to a ground state. The organic light emitting element may emit light based on an operation of the driving circuit. Further, the display layer 130 may include an encapsulation member to protect the organic light emitting element. The organic light emitting element may be easily degraded by external water and oxygen because the organic light emitting element is composed of organic material. Thus, the encapsulation member that includes organic material and inorganic material may be formed on the organic light emitting element to protect the organic light emitting element. The encapsulation layer may include at least one organic layer and at least one inorganic layer. For example, the encapsulation layer may have a structure in which the organic layers and the inorganic layers are alternately formed.

The viewing angle control layer 140 may be formed at a side of the second substrate 120 facing the first substrate 110. The viewing angle control layer 140 may change an output path of light input from the display layer 130 by changing a shape based on a control signal.

In embodiments, the viewing angle control layer 140 may include a piezoelectric element 144 and a transparent elastomer 145. The viewing angle control layer 140 may have a structure in which the piezoelectric element 144 and the transparent elastomer 145 are alternately disposed. The piezoelectric element 144 may include a first transparent electrode 141, a second transparent electrode 142, and a piezoelectric material 143. A shape of the piezoelectric material 143 may be changed based on a polarity of a control signal provided to the first transparent electrode 141 and the second transparent electrode 142. A piezoelectric effect is a phenomenon in which electrons are induced when a tensile force or pressure are acted on the piezoelectric material 143. A converse piezoelectric effect is a phenomenon in which the piezoelectric material 143 is contracted or expanded when a voltage is applied to both sides of the piezoelectric material 143. The viewing angle control layer 140 may change the shape of the piezoelectric material 143 using the converse piezoelectric effect. For example, the piezoelectric material 143 may be selected from among lead zirconate titanate (PZT), polyvinylidene fluoride (PVDF), terpolymer, eccentric rotating mass (ERM), linear resonant actuator (LRA), electroactive polymers (EAP), etc. However, the piezoelectric material 143 is not limited thereto.

The shape of the transparent elastomer 145 may be changed by an expansion or a contraction of the piezoelectric element 144. The output path of light may be changed by the shape of the transparent elastomer 145. The transparent elastomer 145 disposed between the piezoelectric elements 144 may be contracted according to a first direction 1ST DIRECTION when the control signal is provided to the first transparent electrode 141 and the second transparent electrode 142 and the piezoelectric material 143 is expanded according to the first direction 1ST DIRECTION. In this case, an angle between a horizontal side and light output from the display layer 130 may be small by passing through a convex surface of the transparent elastomer 145. The transparent elastomer 145 disposed between the piezoelectric elements 144 may be expanded according to the first direction 1ST DIRECTION when the control signal is provided to the first transparent electrode 141 and the second transparent electrode 142 and the piezoelectric material 143 is contracted according to the first direction 1ST DIRECTION. In this case, the angle between the horizontal side and light output from the display layer 130 may be large by passing through a concave surface of the transparent elastomer 145. For example, the transparent elastomer 145 may be selected from among a silicon rubber, a urethane rubber, an acrylic rubber, a styrene butadiene rubber, a soft polyvinyl chloride, an ethylene propylene copolymer, an ethylene butylene copolymer, an ethylene vinyl acetate copolymer, etc. However, a material of the transparent elastomer 145 may not be limited thereto.

The viewing angle control layer 140 may be coupled to a viewing angle controller (not shown) that receives the viewing angle mode information and provides the control signal based on the viewing angle mode information. The viewing angle controller may receive the viewing angle mode information. The viewing angle mode information may be input by a user or by a sensor. The viewing angle controller may output the control signal that expands the piezoelectric element 144 according to the first direction 1ST DIRECTION when the viewing angle mode information which is a wide viewing angle mode is provided to the viewing angle controller. The piezoelectric element 144 may be expanded according to the first direction 1ST DIRECTION in response to the control signal, and the transparent elastomer 145 may be contracted according to the first direction 1ST DIRECTION. The angle of light output from the display layer 130 may be changed by passing through the convex surface of the transparent elastomer 145. An image having wide viewing angle may be displayed. The viewing angle controller may output the control signal that contracts the piezoelectric element 144 according to the first direction 1ST DIRECTION when the viewing angle mode information which is a narrow viewing angle mode is provided to the viewing angle controller. The piezoelectric element 144 may be contracted according to the first direction 1ST DIRECTION in response to the control signal, and the transparent elastomer 145 may be expanded according to the first direction 1ST DIRECTION. The angle of light output from the display layer 130 may be changed by passing through the concave surface of the transparent elastomer 145. An image having narrow viewing angle may be displayed.

The organic light emitting display panel 100 having the viewing angle control layer 140 disposed on the side of the second substrate 120 facing the first substrate 110 is illustrated in FIG. 1. For example, the organic light emitting display panel 100 may further include the viewing angle control layer 140 disposed on a side of the second substrate 120 from which the light is output.

As described above, the organic light emitting display panel 100 may control the output path of light output from the display layer 130 according to the viewing angle mode by including the viewing angle control layer 140 on the surface of the second substrate 120 facing the display layer 130. Here, the viewing angle control layer 140 may change the output path of light passing through the transparent elastomer 145 by including the piezoelectric element 144 and the transparent elastomer 145 disposed between the piezoelectric elements 144 and changing the shape of the transparent elastomer 145 based on the shape of the piezoelectric element 144.

Figure 2:
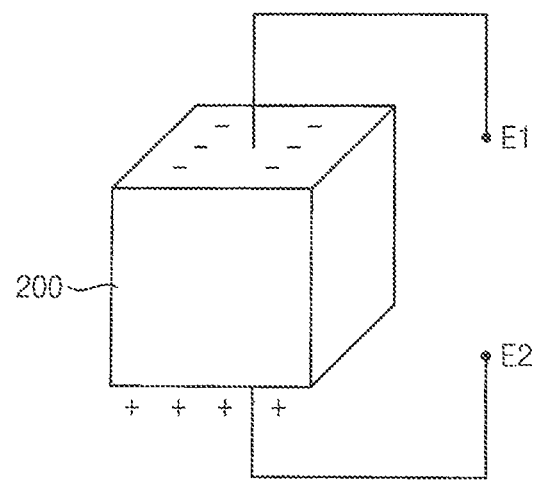
FIG. 2 is a diagram illustrating a piezoelectric material included in the organic light emitting display panel of FIG. 1.
Figure 3A:
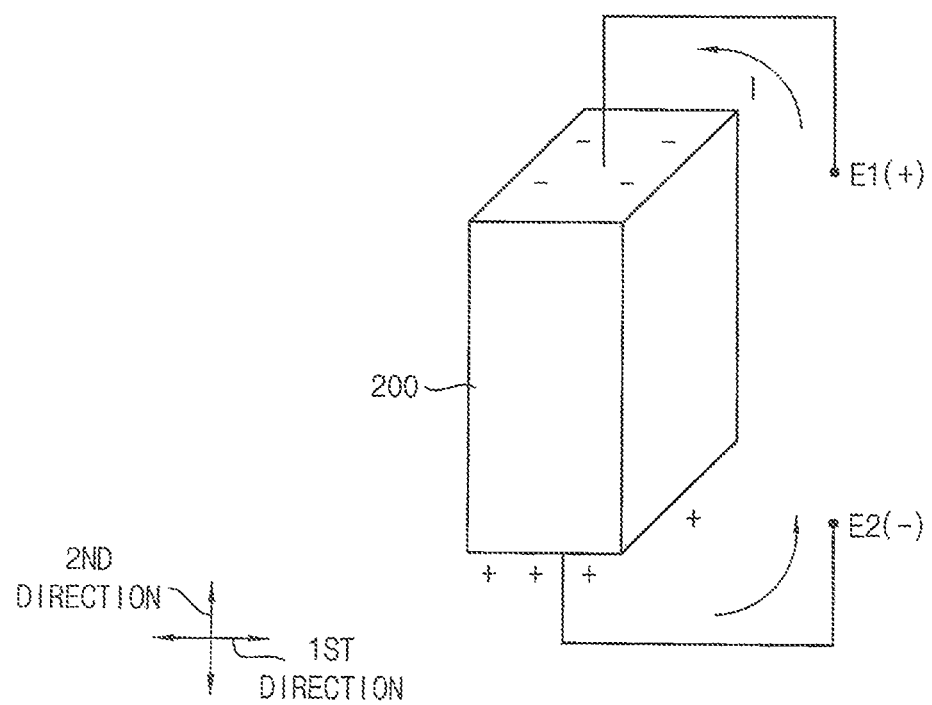
FIGS. 3A and 3B are diagrams illustrating an operation of the piezoelectric material of FIG. 2.
Figure 3B:
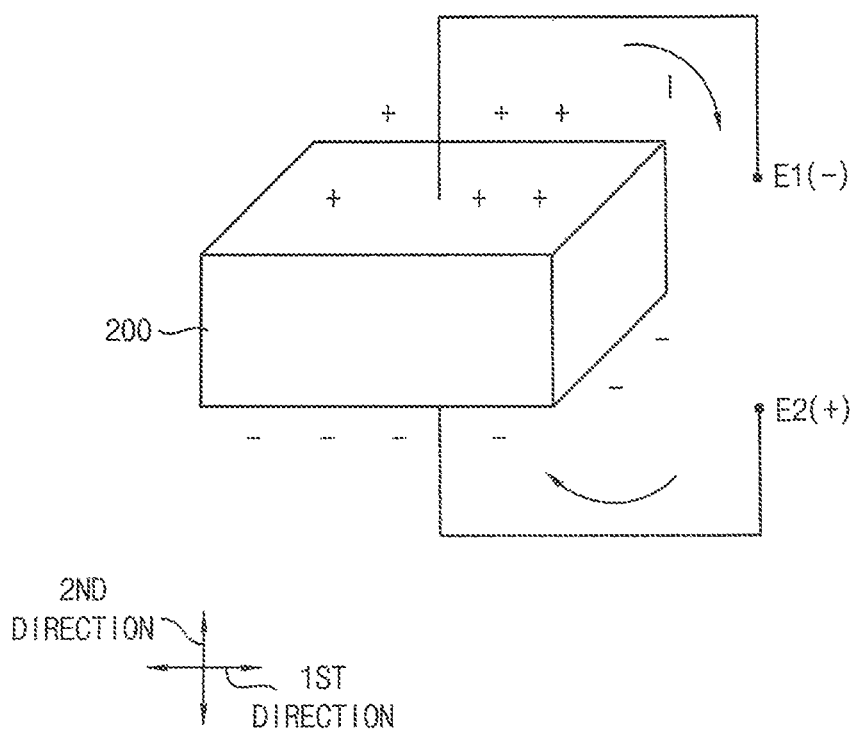

FIG. 2 is a diagram illustrating a piezoelectric material included in the organic light emitting display panel of FIG. 1; and FIGS. 3A and 3B are diagrams illustrating an operation of the piezoelectric material of FIG. 2.

Referring to FIG. 2, a piezoelectric material 200 may include a quartz crystal. Both sides of the piezoelectric material 200 may be coupled to a first electrode E1 and a second electrode E2. A first voltage and a second voltage may be provided to the first electrode E1 and the second electrode E2. A shape of the piezoelectric material 200 may be changed by the converse piezoelectric effect.

Referring to FIG. 3A, a (+) voltage may be provided to the first electrode E1, and a (−) voltage may be provided to the second electrode E2. A (−) ion in an electric field may move to the first electrode E1, and a (+) ion in the electric field may move to the second electrode E2. Here, the quartz crystal of the piezoelectric material 200 may be contracted according to the first direction 1ST DIRECTION.

Referring to FIG. 3*b*, a (−) voltage may be provided to the first electrode E1 and a (+) voltage may be provided to the second electrode E2. The (−) ion in the electric field may move to the second electrode E2, and the (+) ion in the electric field may move to the first electrode E1 Here, the quartz crystal of the piezoelectric material 200 may be expanded according to the first direction 1ST DIRECTION.

As described above, the piezoelectric material 200 may be expanded or contracted based on the voltage applied to both sides of the piezoelectric material 200 by the converse piezoelectric effect.

FIGS. 4A and 46 are diagrams illustrating an operation of a viewing angle control layer included on the organic light emitting display panel of FIG. 1.

Referring to FIG. 4A, a viewing angle control layer 300 may include a piezoelectric element 310 and a transparent elastomer 320. The piezoelectric element 310 and the transparent elastomer 320 may be alternatively disposed according to a first direction 1ST DIRECTION. The piezoelectric element 310 may include a first transparent electrode 312, a second transparent electrode 314, and a piezoelectric material 316. A viewing angle controller may receive a viewing angle mode information and output a control signal based on the viewing angle mode information. The control signal that expands the piezoelectric material 316 according to the first direction 1ST DIRECTION may be provided to the first transparent electrode 312 and the second transparent electrode 314 when the viewing angle controller receives the viewing angle mode information that is a wide viewing angle mode. The piezoelectric element 310 may be expanded according to the first direction 1ST DIRECTION and the transparent elastomer 320 may be contracted according to the first direction 1ST DIRECTION in response to the control signal. An output path of a light L1 output from the display layer may be changed by passing through the transparent elastomer 320 that is contracted. An angle of the light L1 output from the display layer may be changed by passing through the convex side of the transparent elastomer 320 that is contracted according to the first direction 1ST DIRECTION. That is, an angle between a light L2 and a horizontal side may be smaller than an angle between the light L1 and the horizontal side. Thus, a wide viewing angle mode may be performed.

Referring to FIG. 4B, a viewing angle control layer 400 may include a piezoelectric element 410 and a transparent elastomer 420. The piezoelectric element 410 and the transparent elastomer 420 may be alternately disposed according to the first direction 1ST DIRECTION. The piezoelectric element 410 may include a first transparent electrode 412, a second transparent electrode 414, and a piezoelectric material 416. A viewing angle controller may receive a viewing angle mode information and output a control signal based on the viewing angle mode information. The control signal that contracts the piezoelectric material 416 according to the first direction 1ST DIRECTION may be provided to the first transparent electrode 412 and the second transparent electrode 414 when the viewing angle controller receives the viewing angle mode information that is a narrow viewing angle mode. The piezoelectric element 410 may be contracted according to the first direction 1ST DIRECTION, and the transparent elastomer 420 may be expanded according to the first direction 1ST DIRECTION in response to the control signal. An output path of a light L1 output from the display layer may be changed by passing through the transparent elastomer 420 that is expanded. An angle of the light L1 output from the display layer may be changed by passing through the concave side of the transparent elastomer 420 that is expanded according to the first direction 1ST DIRECTION. That is, an angle between a light L2 and a horizontal side may be larger than an angle between the light L1 and the horizontal side. Thus, a narrow viewing angle mode may be performed.

FIG. 5 is a diagram illustrating an organic light emitting display panel according to other example embodiments.

An organic light emitting display panel 500 may have substantially a same structure as the organic light emitting display panel 100 except that a second viewing angle control layer 550 is disposed on a second substrate 520.

Referring to FIG. 5, the organic light emitting display panel 500 may include a first substrate 510, the second substrate 520, a display layer 530, a first viewing angle control layer 540, and the second viewing angle control layer 550.

The second viewing angle control layer 550 may be formed on a side of the second substrate 520 from which light is output. The second viewing angle control layer 550 may have the same structure as the first viewing angle control layer 540 formed on a side of the second substrate 520 opposite to the first substrate 510. The second viewing angle control layer 550 may include a piezoelectric element 554 and a transparent elastomer 555. The piezoelectric element 554 and the transparent elastomer 555 may be alternately disposed in the second viewing angle control layer 550. The piezoelectric element 554 may include a first transparent electrode 551, a second transparent electrode 552, and a piezoelectric material 553. A shape of the piezoelectric material 553 may be changed based on a polarity of a control signal provided to the first transparent electrode 551 and the second transparent electrode 552. A shape of the transparent elastomer 555 may be changed according to a contraction or an expansion of the piezoelectric element 554.

A light output from the display panel 530 may be entered to the second viewing angle control layer 550 passing through the first viewing angle control layer 540 and the second substrate 520. An output path of the light output from the second substrate 520 may be changed by passing through the second viewing angle control layer 550.

The first viewing angle control layer 540 and the second viewing angle control layer 550 may be coupled to a viewing angle controller. In some example embodiments, the viewing angle controller may output a control signal that concurrently (e.g., simultaneously) controls the first viewing angle control layer 540 and the second viewing angle control layer 550. In this case, a piezoelectric element of the first viewing angle control layer 540 and the piezoelectric element 554 of the second viewing angle control layer 550 may be concurrently (e.g., simultaneously) expanded or contracted. A shape of a transparent elastomer of the first viewing angle control layer 540 and a shape of the transparent elastomer 555 of the second viewing angle control layer 550 may be concurrently (e.g., simultaneously) changed by the shape of the piezoelectric element of the first viewing angle control layer 540 and the shape of the piezoelectric element 554 of the second viewing angle control layer 550. In other example embodiments, the viewing angle controller may output a control signal that respectively controls the first viewing angle control layer 540 and the second viewing angle control layer 550. In this case, an amount of the contraction or the expansion of the piezoelectric element of the first viewing angle control layer 540 and an amount of the contraction or the expansion of the piezoelectric element 554 of the second viewing angle control layer 550 may be different. Thus, a shape of the transparent elastomer of the first viewing angle control layer 540 and a shape of the transparent elastomer 555 of the second viewing angle control layer 550 may be different. Therefore, an angle of the light from the display layer 530 may be minutely controlled. Alternatively, the viewing angle controller may control one of the first viewing angle control layer 540 or the second viewing angle control layer 550.

As described above, the organic light emitting display panel 500 of FIG. 5 may minutely control a path of the light by including the first viewing angle control layer 540 and the second viewing angle control layer 550 on both sides of the second substrate 520.

Figure 6:
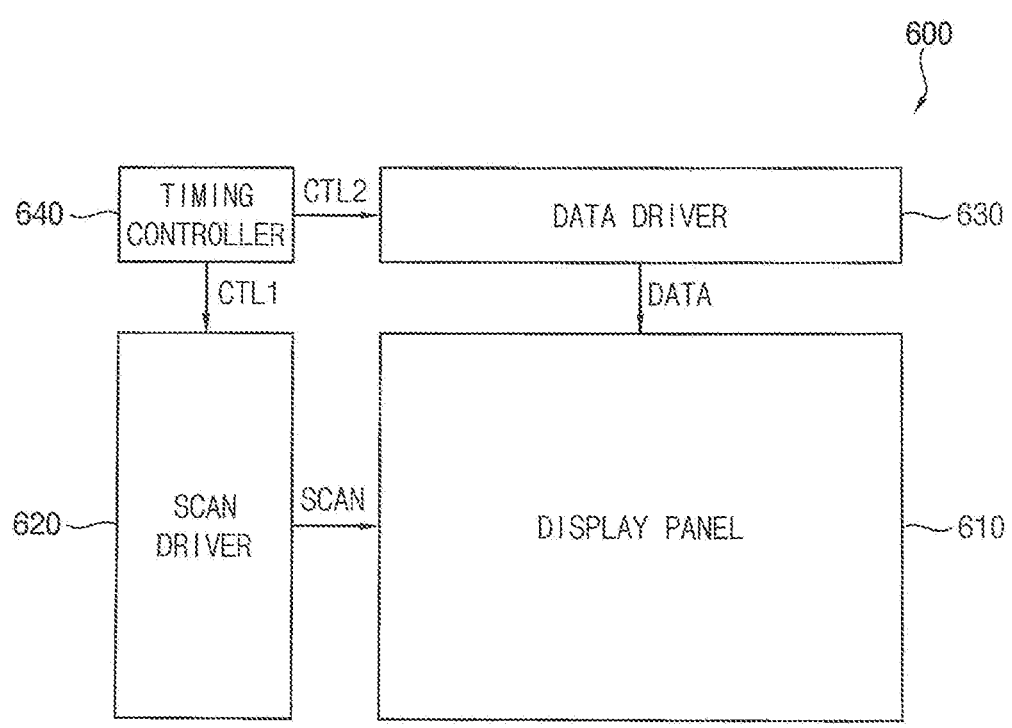
FIG. 6 is a block diagram illustrating an organic light emitting display device according to example embodiments.

FIG. 6 is a block diagram illustrating an organic light emitting display device according to example embodiments.

Referring to FIG. 6, an organic light emitting display device 600 may include a display panel 610, a scan driver 620, a data driver 630, and a timing controller 640.

The display panel 610 may include a plurality of pixels and a viewing angle control layer that changes an output path of light by changing a shape based on a control signal. The display panel 610 may include a first substrate, a second substrate, a display layer, and a viewing angle control layer. The display layer may be formed on the first substrate. Organic light emitting elements and driving circuits for driving the organic light emitting elements may be formed in the display layer. In example embodiments, each of the pixels includes a pixel circuit, a driving transistor, and an organic light emitting diode. A data signal DATA may be provided to the driving transistor in response to a scan signal SCAN provided through a scan line. The driving transistor may control a driving current flowing through the organic light emitting diode based on the data signal DATA. The organic light emitting diode may emit light based on the driving current.

The second substrate may be disposed opposite to the first substrate. The viewing angle control layer may be disposed on a side of the second substrate facing the first substrate. The viewing angle control layer may change an output path of light input from the display layer by changing a shape. The viewing angle control layer may include a piezoelectric element and a transparent elastomer. The piezoelectric element and the transparent elastomer may be alternately disposed. The piezoelectric element may include a first transparent electrode, a second transparent electrode, and a piezoelectric material. A shape of the piezoelectric material may be changed according to a polarity of the control signal. A shape of the transparent elastomer may be changed by a contraction or an expansion of the piezoelectric element. The output path of the light may be changed by the shape of the transparent elastomer. The transparent elastomer may be contracted by the piezoelectric element being expanded when the organic light emitting display device 600 is driven in a wide viewing angle mode. An angle between the light emitted from the display layer and a horizontal side may be small as the light passes a convex surface of the transparent elastomer. Thus, the organic light emitting display device 600 may be driven in the wide viewing angle mode. A user may view the organic light emitting display device 600 at the side of the organic light emitting display device 600. The transparent elastomer may be expanded by the piezoelectric element being contracted when the organic light emitting display device 600 is driven in a narrow viewing angle mode. The angle between the light emitted from the display layer and the horizontal side may be large as the light passes a concave surface of the transparent elastomer. Thus the organic light emitting display device 600 may be driven in the narrow viewing angle mode. A user may not view the organic light emitting display device 600 at the side of the organic light emitting display device 600.

The scan driver 620 may provide the scan signal SCAN to the pixels through a plurality of scan lines. The data driver 630 may provide the data signal DATA to the pixels through a plurality of data lines. The timing controller 640 may generate timing control signals CTL1 and CTL2 that control the scan driver 620 and the data driver 630. The data driver 630 or the timing controller 640 may include the viewing angle control layer that provides the control signal that controls the viewing angle control layer included in the display panel 610.

As described above, the organic light emitting display device 600 of FIG. 6 may change the output path of light from the display layer by including the viewing angle control layer and changing the shape of the transparent elastomer according to the viewing angle mode. Thus, the organic light emitting display device 600 may provide a user a watching mode adjustable to a usage environment.

Figure 7:
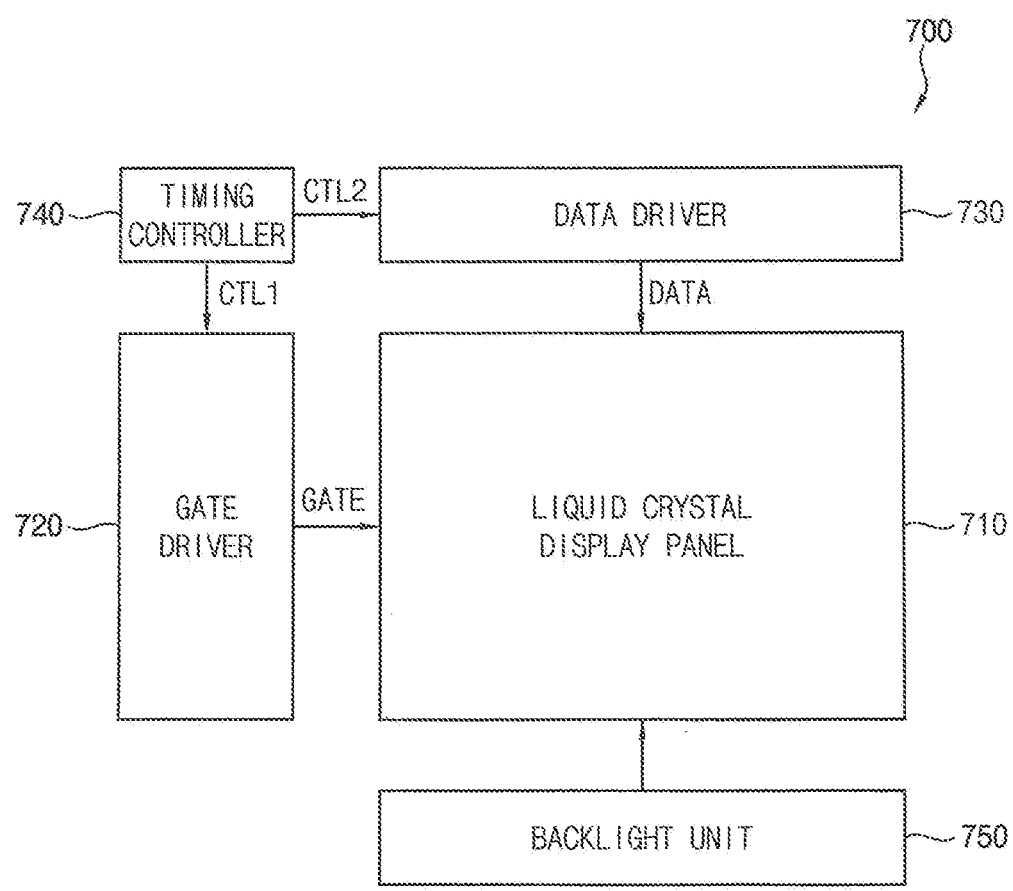
FIG. 7 is a block diagram illustrating a liquid crystal display device according to example embodiments.
Figure 8A:
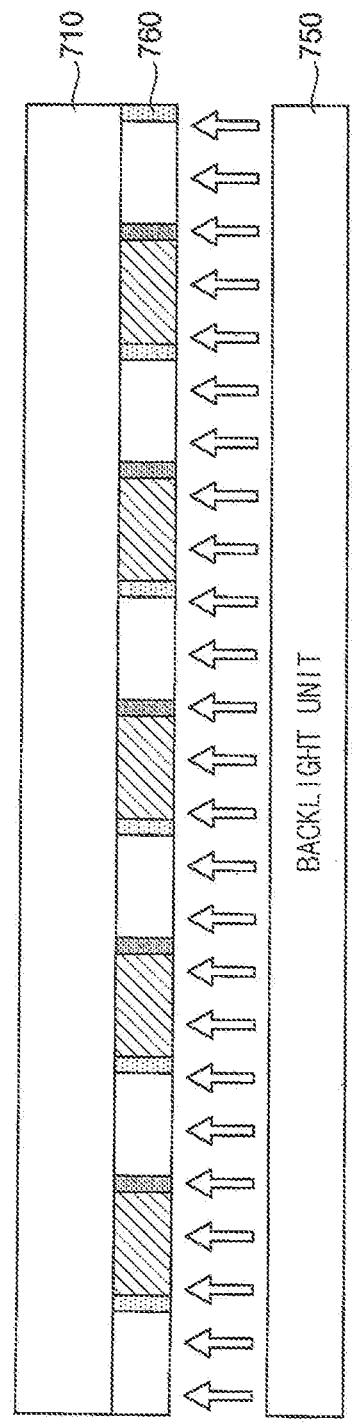
FIGS. 8A and 8B are diagrams illustrating a liquid crystal display panel included in the liquid crystal display device of FIG. 7.
Figure 8B:
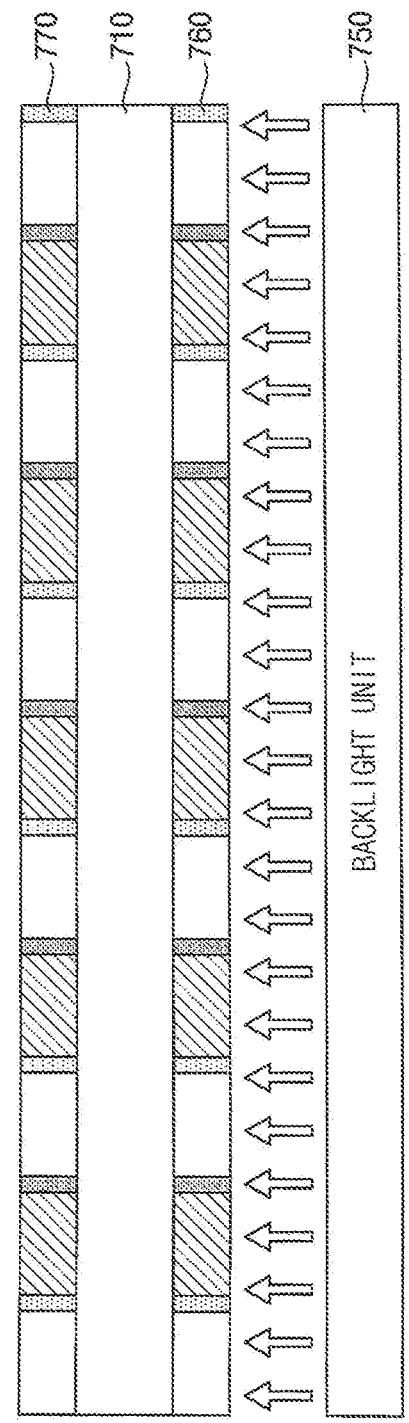

FIG. 7 is a block diagram illustrating a liquid crystal display device according to example embodiments; and FIGS. 8A and 8B are diagrams illustrating a liquid crystal display panel included in the liquid crystal display device of FIG. 7.

Referring to FIG. 7, a liquid crystal display device 700 may include a liquid crystal display panel 710, a gate driver 720, a data driver 730, a timing controller 740, and a backlight unit 750.

A plurality of data lines and a plurality of gate lines are disposed on the liquid crystal display panel 710. A plurality of pixels may be formed in intersection regions of the data lines and the gate lines. The liquid crystal display panel 710 may include liquid crystal and a color filter between a first substrate and a second substrate. The liquid crystal display panel 710 may further include a polarizer that changes a path of light provided from the backlight unit 750.

Referring to FIG. 8A, the liquid crystal display panel may include a viewing angle control layer 760 formed on a side of the liquid crystal display panel 710 to which the light is input from the backlight unit 750. The viewing angle control layer 760 may change the output path of light input from the backlight unit 750 by changing a shape according to the control signal. The viewing angle control layer 760 of FIG. 8A may have substantially a same structure as the viewing angle control layer 140 of FIG. 1.

Referring to FIG. 86, the liquid crystal display panel 710 may include a first viewing angle control layer 760 formed on a side to which the light is input, and a second viewing angle control layer 770 formed on another side from which the light is output. The second viewing angle control layer 770 may have substantially a same structure as the first viewing angle control layer 760. In some example embodiments, the first viewing angle control layer 760 and the second viewing angle control layer 770 may be concurrently (e.g., simultaneously) operated. In other example embodiments, the first viewing angle control layer 760 and the second viewing angle control layer 770 may be respectively operated.

The gate driver 720 may be coupled to the gate lines in the liquid crystal display panel 710. The gate driver 720 may generate a gate signal GATE based on a control signal CTL1 provided from the timing controller 740 and provide the gate signal GATE to the pixels through the gate lines. The data driver 730 may be coupled to the data lines in the liquid crystal display panel 710. The data driver 730 may convert an image signal provided from the timing controller 740 to the data signal DATA. The data driver 730 may provide the data signal DATA to the pixels through the data lines based on a control signal CTL2 provided from the timing controller 740.

The backlight unit 750 may be disposed at a back side of the liquid crystal display panel 710. The backlight unit 750 may provide light to the liquid crystal display panel 710. The backlight unit 750 may include light members that guide the light from a light source (e.g., CCFL or LED) to the liquid crystal display panel 710 and improve efficiency of the light. For example, the light members include a diffuser plate, a prism sheet, a polarizer, etc.

Figure 9:
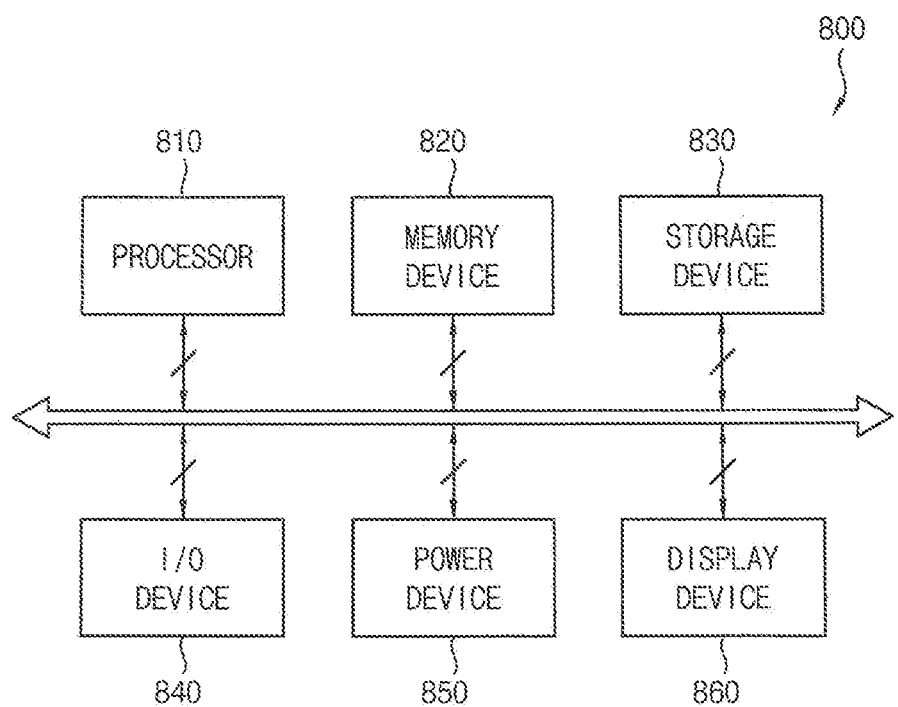
FIG. 9 is a block diagram illustrating an electronic device that includes the organic light emitting display device of FIG. 6 or the liquid crystal display device of FIG. 7.
Figure 10:
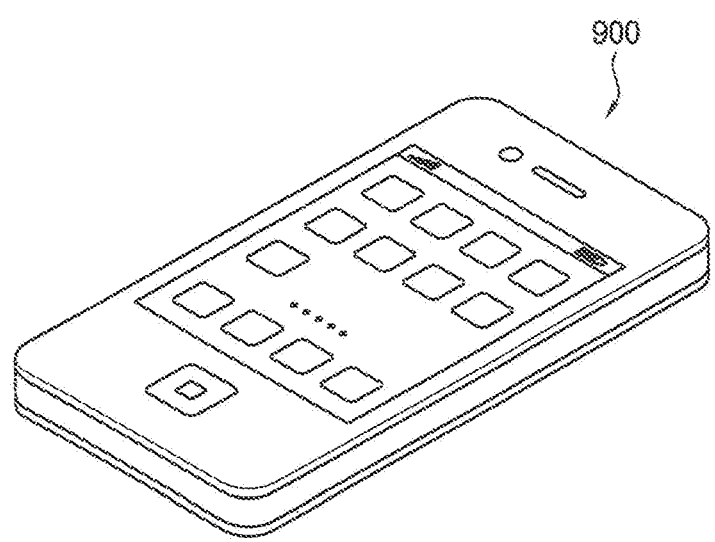
FIG. 10 is a diagram illustrating an example embodiment in which the electronic device of FIG. 9 is implemented as a smartphone.

FIG. 9 is a block diagram illustrating an electronic device that includes the organic light emitting display device of FIG. 6 or the liquid crystal display device of FIG. 7; and FIG. 10 is a diagram illustrating an example embodiment in which the electronic device of FIG. 9 is implemented as a smartphone.

Referring to FIGS. 9 and 10, an electronic device 800 may include a processor 810, a memory device 820, a storage device 830, an input/output (I/O) device 840, a power device 850, and a display device 860. Here, the display device 860 may correspond to the organic light emitting display device 600 of FIG. 6 or the liquid crystal display device 700 of FIG. 7. In addition, the electronic device 800 may further include a plurality of ports for communicating with a video card, a sound card, a memory card, a universal serial bus (USB) device, other electronic device, etc. Although it is illustrated in FIG. 10 that the electronic device 800 may be implemented as a smartphone 900, a kind of the electronic device 800 is not limited thereto.

The processor 810 may perform various computing functions. The processor 810 may be a microprocessor, a central processing unit (CPU), etc. The processor 810 may be coupled to other components via an address bus, a control bus, a data bus, etc. Further, the processor 810 may be coupled to an extended bus, such as a peripheral component interconnect (PCI) bus. The memory device 820 may store data for operations of the electronic device 800. For example, the memory device 820 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, etc. The storage device 830 may be a solid stage drive (SSD) device, a hard disk drive (HDD) device, a CD-ROM device, etc.

The I/O device 840 may be an input device such as a keyboard, a keypad, a touchpad, a touch-screen, a mouse, etc., and an output device such as a printer, a speaker, etc. In some example embodiments, the display device 860 may be included in the I/O device 840. The power device 850 may provide a power for operations of the electronic device 800. The display device 860 may communicate with other components via the buses or other communication links. As described above, the display device 860 may include a viewing angle control layer. The viewing angle control layer may include a piezoelectric element of which a shape is changed by a control signal and a transparent elastomer formed between the piezoelectric elements. The shape of the piezoelectric element may be changed by a voltage applied to both sides of the piezoelectric element. A shape of the transparent elastomer may be changed by the shape of the piezoelectric element. The transparent elastomer may have a convex surface or a concave surface. A path of light input to the viewing angle control layer may be changed by passing through the transparent elastomer. For example, the transparent elastomer may be contracted by an expansion of the piezoelectric element when the display device 860 of the electronic device 800 is driven in a wide viewing angle mode. The light input to the viewing angle control layer may be spread by passing through the convex surface of the transparent elastomer. Thus, the wide viewing angle mode of the display device 860 may be implemented. The transparent elastomer may be expanded by a contraction of the piezoelectric element when the display device 860 of the electronic device 800 is driven in a narrow angle mode. The light input to the viewing angle control layer may be gathered by passing through the concave surface of the transparent elastomer. Thus, the narrow viewing angle mode of the display device 860 may be implemented. As described above, the electronic device 800 of FIG. 9 may provide a viewing mode which is adjustable to a usage environment by including the display device 860 having the viewing angle control layer.

The present inventive concept may be applied to a display device and an electronic device having the display device. For example, the present inventive concept may be applied to a computer monitor, a laptop, a digital camera, a cellular phone, a smartphone, a smart pad, a television, a personal digital assistant (PDA), a portable multimedia player (PMP), an MP3 player, a navigation system, a game console, a video phone, etc.

The foregoing is illustrative of some example embodiments and is not to be construed as limiting thereof. Although some example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display panel comprising:
   a first substrate;
   a second substrate arranged opposite to the first substrate;
   a display layer on a side of the first substrate facing the second substrate, wherein organic light emitting elements are arranged in the display layer; and
   a viewing angle control layer on a side of the second substrate facing the first substrate, the viewing angle control layer configured to change an output path of light input from the display layer based on a control signal,
   wherein the viewing angle control layer comprises:
   piezoelectric elements configured to change a shape thereof based on the control signal; and
   a transparent elastomer arranged between the piezoelectric elements and configured to change a shape thereof based on a change of the shape of the piezoelectric elements so as to change the output path of the light passing through the transparent elastomer.

2. The organic light emitting display panel of claim 1, wherein the viewing angle control layer includes the piezoelectric elements and the transparent elastomers alternately arranged.

3. The organic light emitting display panel of claim 1, wherein the piezoelectric elements include:

a first transparent electrode and a second transparent electrode configured to receive the control signal; and
a piezoelectric material between the first transparent electrode and the second transparent electrode.

4. The organic light emitting display panel of claim 1, wherein the shape of the piezoelectric element is changed based on a polarity of the control signal.

5. The organic light emitting display panel of claim 1, wherein the transparent elastomer contracts or expands based on the shape of the piezoelectric element.

6. The organic light emitting display panel of claim 1, wherein the viewing angle control layer is coupled to a viewing angle controller that receives a viewing angle mode information and provides the control signal based on the viewing angle mode information.

7. The organic light emitting display panel of claim 6, wherein the piezoelectric element is expanded and the transparent elastomer is contracted based on the control signal when the viewing angle mode information is a wide viewing angle mode.

8. The organic light emitting display panel of claim 6, wherein the piezoelectric element is contracted and the transparent elastomer is expanded based on the control signal when the viewing angle mode information is a narrow viewing angle mode.

9. The organic light emitting display panel of claim 1, further comprising:
another viewing angle control layer on another side of the second substrate from which light is emitted.

10. An organic light emitting display device comprising:
a display panel including a plurality of pixels and a viewing angle control layer that changes an output path of light based on a control signal;
a scan driver configured to provide a scan signal to the display panel;
a data driver configured to provide a data signal to the display panel; and
a timing controller configured to provide a control signal to the scan driver and the data driver,
wherein the viewing angle control layer comprises:
piezoelectric elements configured to change a shape thereof based on the control signal; and
a transparent elastomer arranged between the piezoelectric elements and configured to change a shape thereof based on a change of the shape of the piezoelectric elements so as to change the output path of the light passing through the transparent elastomer.

11. The organic light emitting display device of claim 10, wherein the display panel includes:
a first substrate;
a second substrate arranged opposite to the first substrate;
a display layer on a side of the first substrate facing the second substrate, wherein organic light emitting elements are arranged in the display layer; and
the viewing angle control layer on a side of the second substrate facing the first substrate, wherein the viewing angle control layer is configured to change an output path of light input from the display layer based on the control signal.

12. The organic light emitting display device of claim 10, wherein the viewing angle control layer includes the piezoelectric elements and the transparent elastomers alternately disposed.

13. The organic light emitting display device of claim 10, wherein the piezoelectric elements include:
a first transparent electrode and a second transparent electrode configured to receive the control signal; and
a piezoelectric material between the first transparent electrode and the second transparent electrode.

14. A liquid crystal display device comprising:
a liquid crystal display panel including a plurality of pixels;
a backlight unit configured to provide light to the liquid crystal display panel;
a viewing angle control layer on a side of the liquid crystal display panel facing the backlight unit, the viewing angle control layer configured to change an output path of light input from the backlight unit based on a control signal,
wherein the viewing angle control layer comprises:
piezoelectric elements configured to change a shape thereof based on the control signal; and
a transparent elastomer arranged between the piezoelectric elements and configured to change a shape thereof based on a change of the shape of the piezoelectric elements so as to change the output path of the light passing through the transparent elastomer.

15. The liquid crystal display device of claim 14, wherein the piezoelectric elements include:
a first transparent electrode and a second transparent electrode configured to receive the control signal; and
a piezoelectric material between the first transparent electrode and the second transparent electrode.

16. The liquid crystal display device of claim 14, further comprising:
another viewing angle control layer on another side of the liquid crystal display panel from which the light is output.

* * * * *